US012701978B2

(12) United States Patent　　　　　(10) Patent No.: US 12,701,978 B2
Huang et al.　　　　　　　　　　　　　(45) Date of Patent:　　　　Aug. 4, 2026

(54) DOPING FREE CONNECTION STRUCTURES AND METHODS

(71) Applicant: Taiwan Semiconductor Manufacturing Company, Ltd., Hsinchu (TW)

(72) Inventors: Shih-Min Huang, Hsinchu (TW); Tzu-Jui Wang, Fengshan (TW); Jung-I Lin, Hsinchu (TW); Hung-Chang Chien, Hsinchu (TW); Kuan-Chieh Huang, Hsinchu (TW); Tzu-Hsuan Hsu, Kaohsiung (TW); Chen-Jong Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 561 days.

(21) Appl. No.: 18/170,785

(22) Filed: Feb. 17, 2023

(65) Prior Publication Data

US 2024/0145298 A1　　　May 2, 2024

Related U.S. Application Data

(60) Provisional application No. 63/381,044, filed on Oct. 26, 2022.

(51) Int. Cl.
| | |
|---|---|
| *H10W 20/00* | (2026.01) |
| *H10F 30/225* | (2025.01) |
| *H10P 14/20* | (2026.01) |
| *H10P 14/60* | (2026.01) |
| *H10W 10/00* | (2026.01) |
| *H10W 10/17* | (2026.01) |

(52) U.S. Cl.
CPC ........... *H10W 20/074* (2026.01); *H10P 14/34* (2026.01); *H10P 14/6349* (2026.01); *H10W 10/0143* (2026.01); *H10W 10/17* (2026.01); *H10W 20/069* (2026.01); *H10W 20/098* (2026.01); *H10F 30/225* (2025.01)

(58) Field of Classification Search
None
See application file for complete search history.

(56) References Cited

U.S. PATENT DOCUMENTS

| | | | | |
|---|---|---|---|---|
| 11,177,322 B2 * | 11/2021 | Lee | ........................ | H10F 39/014 |
| 2010/0271108 A1 * | 10/2010 | Sanfilippo | ............. | H10F 77/241 |
| | | | | 257/438 |

(Continued)

OTHER PUBLICATIONS

Wei et al, CN 113314638A, Near-Infrared Single-photon Avalanche Diode Detector and Manufacturing Method Thereof, Aug. 27, 2021 (Year: 2021).*

*Primary Examiner* — Alexander G Ghyka
(74) *Attorney, Agent, or Firm* — Ingrassia Fisher & Lorenz, LLP | IF&L

(57) ABSTRACT

Structures with doping free connections and methods of fabrication are provided. An exemplary structure includes a substrate; a first region of a first conductivity type formed in the substrate; an overlying layer located over the substrate; a well region of a second conductivity type formed in the overlying layer; a conductive plug laterally adjacent to the well region and extending through the overlying layer to electrically contact with the first region; and a passivation layer located between the conductive plug and the well region.

20 Claims, 8 Drawing Sheets

(56)                    References Cited

U.S. PATENT DOCUMENTS

| | | | | |
|---|---|---|---|---|
| 2018/0090536 | A1* | 3/2018 | Mandai | ................. H10F 39/807 |
| 2019/0097075 | A1* | 3/2019 | Rae | ....................... H10F 39/103 |
| 2020/0259033 | A1* | 8/2020 | Cadugan | .............. H10F 30/225 |
| 2021/0343762 | A1* | 11/2021 | King | .................. H10F 39/8037 |
| 2023/0065063 | A1* | 3/2023 | Zheng | .................. H10F 39/024 |

* cited by examiner

DOPING FREE CONNECTION STRUCTURES AND METHODS

CROSS-REFERENCE TO RELATED APPLICATION

This application claims the benefit of U.S. Provisional Application No. 63/381,044, filed Oct. 26, 2022.

BACKGROUND

Various semiconductor devices utilize diodes. The diodes may be built as a part of an integrated circuit that includes a P-type substrate and an N-type Buried Layer (NBL) over the substrate. The anode of such a diode may include a High-Voltage P-type Well (HVPW) over the NBL and a P+ region over the HVPW. The cathode of the diode may include a High-Voltage N-type Well (HVNW) over the NBL and an N+ region over the HVNW.

Such diodes may generate unwanted electron field regions at material interfaces, resulting in defect-induced electron generation rate and high defect density area at the interfaces. Also, such diodes may exhibit electron leakage paths. Further, the space required by such doped connection paths formed by doped regions may limit the scaling down of devices and may cause Premature Edge Breakdown (PEB) when devices are scaled down.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

Figure 1:
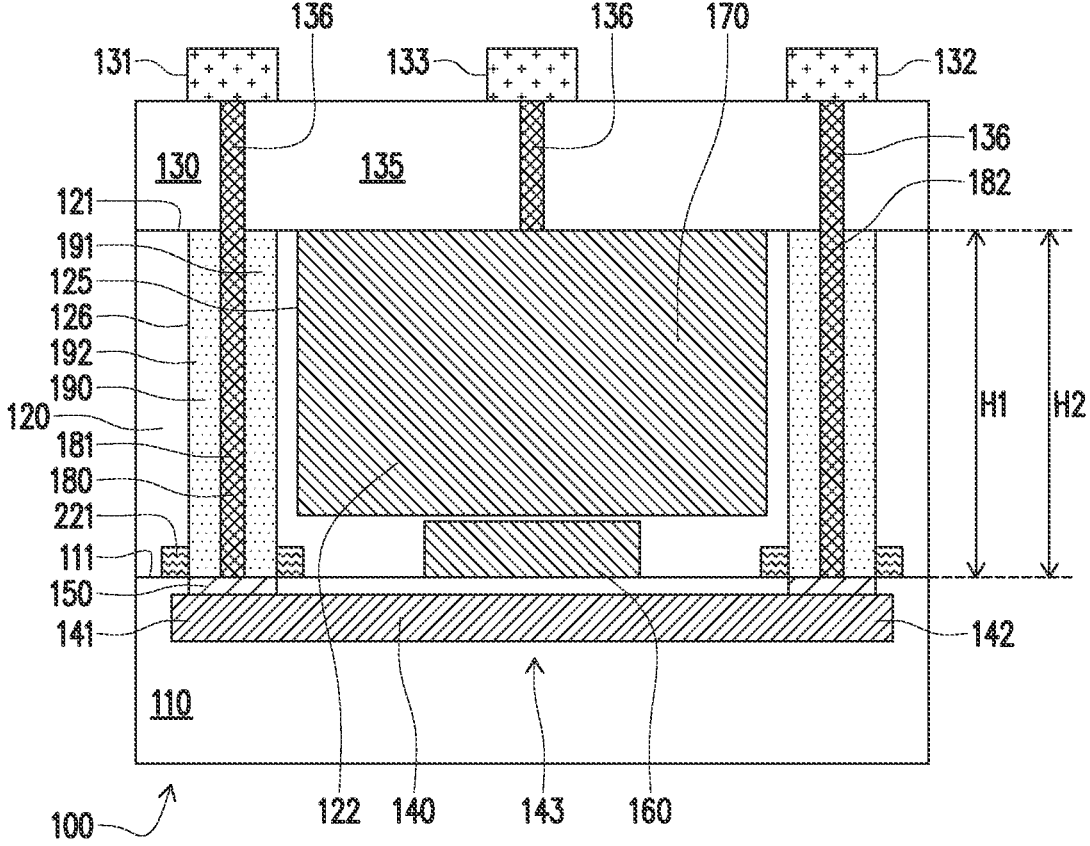
FIG. 1 is a cross-sectional schematic view of a structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, typical techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many typical processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

As used herein, a "material layer" or a layer that is a "material" includes at least 50 wt. % of the identified material, for example at least 60 wt. % of the identified material, such at least 75 wt. % of the identified material or at least 90 wt. % of the identified material. For example, each of a germanium layer and a layer that is germanium is a layer that is at least 50 wt. %, at least 60 wt. %, at least 75 wt. %, or at least 90 wt. % germanium.

In addition, the present disclosure may repeat reference numerals and/or letters in the various examples. This repetition is for the purpose of simplicity and clarity and does not in itself dictate a relationship between the various embodiments and/or configurations discussed.

Various embodiments are discussed herein in a particular context, namely, in the context of a single photon avalanche diode (SPAD) image sensor. A SPAD image sensor can detect incident radiation with very low intensities (e.g., a single photon). The SPAD image sensor includes a plurality of SPAD cells arranged in an array. The SPAD cells respectively include a p-n junction, a quench circuit, and a read circuit. The p-n junction operates at a reverse bias well above its breakdown voltage. During operation, photo-generated carriers move to a depletion region (i.e., a multiplication region) of the p-n junction and trigger an avalanche effect such that a signal current can be detected.

While embodiments herein are described in relation to SPAD structures, embodiments are not limited to such structures. For example, embodiments may be utilized with heterojunction diodes, such as a P—Ge/i-Si/N—Si structures, or with other structures that may benefit from the connection structure described herein, such as a vertical conductive path through silicon.

In certain embodiments, a doped region is located within a cavity formed in an epitaxial layer, such as an epitaxial silicon layer. In exemplary embodiments, the doped region is germanium. In typical designs, there may be a high defect density at the cavity interface, e.g., at the silicon/germanium interface. Embodiments herein are provided to reduce the defect density at the cavity interface.

Further, in typical processing, heavily doped plug regions typically extend down from an electrical contact to a doped buried region. These heavily doped plug regions are laterally spaced from the doped region in the silicon cavity and are of the opposite conductivity type. As feature size is reduced, the space between boundary of the silicon cavity and the heavily doped plug region is too small to perform effective ion implantation and may cause Premature Edge Breakdown (PEB).

Furthermore, the reduced silicon area between the sidewall of the germanium region and the heavily doped plug region leads to a breakdown risk that can cause silicon device malfunction.

Embodiments herein allow for reduced spacing within and between cells. As a result, embodiments herein improve the fill factor of devices including cells.

In exemplary embodiments herein, the electrical connection to the doped buried region lying under the germanium region is formed by a metal connection. The metal connection avoids generating an electron field region around the silicon/germanium interface. As a result, defect-induced electron generation rate can be reduced and the dark current (DC) can be improved. Also, fill factor (FF) can be improved by reducing the necessary distance between the germanium region and the electrical connection and/or by reducing the necessary distance between the electrical connection and the deep trench isolation surrounding each cell. Further, the magnitude of effects on device performance caused by variance in germanium epitaxy quality may be reduced. In addition, premature edge breakdown may be avoided. Also, electron leakage path outside the active area can be eliminated.

In exemplary embodiments, a passivated metal connection is electrically connected to the doped buried region lying under the germanium region. For example, the metal connection may be surrounded by a passivation layer, such as an oxide or a high-k dielectric material. The passivation layer prevents formation of an electron field and eliminates a leakage path. Because there is no electron escaping path from the doped region to the metal plug, leakage current is avoided.

Also, because the distance from the cavity interface to the metal plug is only limited by process capability, fill factor is improved and the capability for reduced footprint is increased. Further, electrical crosstalk is reduced.

Embodiments herein provide for forming electrical connections to buried doped regions in which the processing does not include doping or ion implantation processes. Rather, electrical connection formation relies only on etching and deposition processes.

FIG. 1 is a schematic cross-sectional view of a structure 100, such as a diode structure, for example a single photon avalanche diode (SPAD) structure. As shown, the structure 100 includes a base substrate 110, such as a silicon substrate. Also, the structure 100 includes an overlying layer 120, such as an epitaxial layer, that lies over the base substrate 110. In exemplary embodiments, the overlying layer is silicon. Also, an interconnection layer 130, including dielectric and metal lines, may be provided over the structure 100 for electrical connection to the structure 100 an integration with other semiconductor components. A lower interface 111 is defined at the contact between the top surface of the substrate 110 and the bottom surface of the layer 120. An upper interface 121 is defined at the contact between the top surface of the layer 120 and the bottom surface of the layer 130.

As shown, a first region or buried doped layer 140 is located in the substrate 110. In exemplary embodiments, the buried doped layer 140 is heavily doped with a first conductivity type, e.g., with N-type. The buried doped layer 140 may be referred to as a contact layer or an N++ contact sheet. The buried doped layer 140 extends horizontally from a first end 141 to a second end 142 and includes a central region 143 therebetween.

As shown, more heavily doped regions 150 may be formed above the ends 141 and 142 of the buried doped layer 140. In exemplary embodiments, the more heavily doped regions 150 are heavily doped with the first conductivity type, e.g., with N-type. In certain embodiments, the more heavily doped regions 150 may be considered to be part of the buried doped layer 140.

As shown, a second region or doped region 160 is formed in the overlying layer 120. An exemplary doped region 160 is heavily doped with the second conductivity type, e.g., with P-type. The doped region 160 may be referred to as a charge sheet or a P+ charge sheet.

As further shown, the structure 100 includes a cavity 122 formed in the overlying layer 120, such that a cavity interface 125 is located between the cavity 122 and the overlying layer 120.

A well region or material region 170 is located in the cavity 122. In exemplary embodiments, the material region 170 is germanium and may be referred to as a germanium well. In exemplary embodiments, the material region 170 is doped with the second conductivity type, e.g., P-type. The material region 170 may be referred to as an adsorption layer.

As shown, the cavity 122 and material region 170 lie directly, i.e., in a vertical direction, over the central region 143 of the buried doped layer 140, but not directly over the ends 141 and 142 of the buried doped layer 140.

In FIG. 1, holes 126 are formed in the overlying layer 120 and extend from the upper interface 121 to the lower interface 111, i.e., completely through the overlying layer 120.

Further, as shown, metal connections or plugs 180 are located in the holes 126 and extend from contact with the buried doped layer 140 (through more heavily doped regions 150) to the upper interface 121. Each metal plug 180 is laterally distanced from the material region 170.

In certain embodiments, the holes 126 illustrated in the cross-sectional view of FIG. 1 are opposite portions of an annular hole or channel distanced from and surrounding the material region 170. In such embodiments, each illustrated metal plug 180 is a portion of an annular plug 180. Specifically, in the cross-sectional view, a first plug portion 181 contacts the first end 141 of the buried doped region 140 and a second plug portion 182 contacts the second end 142 of the buried doped region 140. In certain embodiments, the buried doped region 140 extends beyond the annular plug 180 in the horizontal direction and the contact between the plug 180 and the buried doped region 140 is annular.

In other embodiments, the holes 126 illustrated in the cross-sectional view of FIG. 1 are distinct, i.e., are not connected. In such embodiments, each illustrated metal plug 180 is a distinct metal plug 180 and are not physically connected.

As shown, a passivation layer 190 is also located in the holes 126. In exemplary embodiments, the passivation layer 190 is located between the metal connections 180 and the material region 170. For example, an exemplary passivation layer 190 completely surrounds the metal connections 180 in the lateral direction, i.e., radially. Only the bottom surfaces of the metal connections 180 (in electrical contact with the more highly doped regions 150) and the top surface of the metal connections 180 (in electrical connection with overlying contacts described below) are not contacted by the passivation layer 190. The passivation layer 190 completely separates the metal connections 180 from the overlying layer 120.

In embodiments in which the metal plug 180 is annular, the passivation layer 190 includes an inner passivation layer 191 located between the metal plug 180 and the material region 170 and may include an outer passivation layer 192 located between the metal plug 180 and a deep trench isolation (illustrated below).

In embodiments in which the metal plug 180 includes distinct columns, the passivation layer 190 may be a single continuous layer that laterally surrounds the metal plug 180.

As shown, layer 130 includes dielectric material 135 with electrical connections 136 to cathode 131, cathode 132, and anode 133, respectively. As shown, the electrical connections 136 are in electrical contact with the metal plugs 180 or the material region 170.

As shown in FIG. 1, the metal plug 180 has a height H1, the epitaxial layer 120 has a height H2, and the height H1 is greater than or equal to the height H2. In certain embodiments, the height H2 of the epitaxial layer 120 is from 0.5 to 10 micrometers (μm).

FIG. 1 further illustrates the result of an optional processing technique. Specifically, etch stop layer remnants 221 are located in the overlying layer 120 at the base of the holes 126. If an etch stop layer is used to accurately form the holes 126, then the etch stop layer remnants 221 will be present. If no etch stop layer is used, then no etch stop layer remnants will be present.

Figure 2:
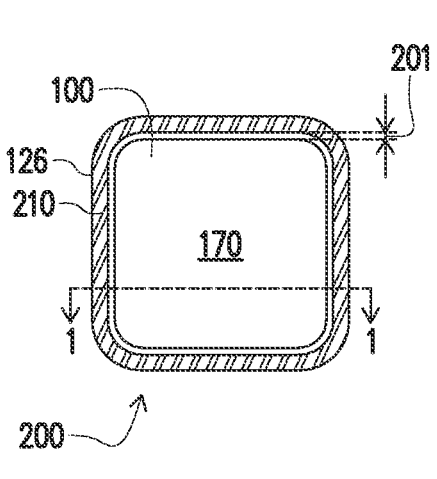
FIG. 2 is a top schematic view of a cell including the structure of FIG. 1.

Referring now to FIG. 2, an overhead view of a single cell 200 including the structure 100 of FIG. 1 is shown according to the embodiment in which the hole 126 is annular. Such an embodiment may be referred to as having a ring type metal connect. For example, the cross-sectional view of FIG. 1 may be taken along line 1-1 in FIG. 2. In FIG. 2, the metal plug and passivation layer are collectively referred to as a passivated metal plug and are numbered 210. As shown, the hole 126 and passivated metal plug 210 are located at a distance 201 from the material region 170.

Figure 3:
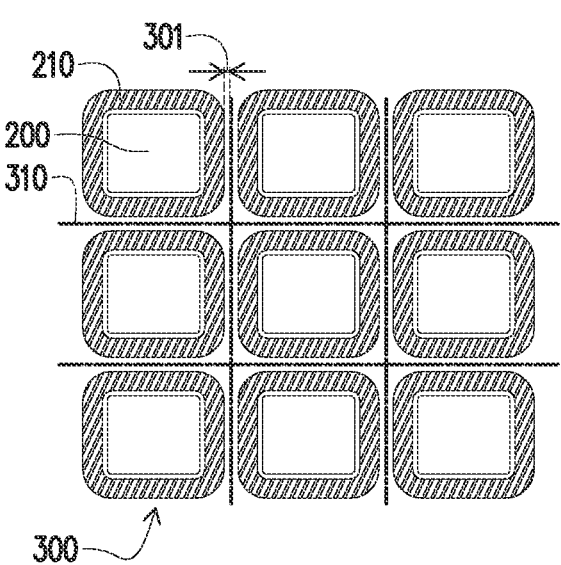
FIG. 3 is a top schematic view of an array of cells, such as the cell of FIG. 2, in accordance with some embodiments.

FIG. 3 illustrates an array 300 of cells 200, such as the cell 200 of FIG. 2. As shown, in the array 300, each cell 200 is separated and insulated from adjacent cells 200 by deep trench isolation (DTI) 310. Each passivated metal plug 210 is located at a distance 301 from each respective deep trench isolation (DTI) 310.

Figure 4:
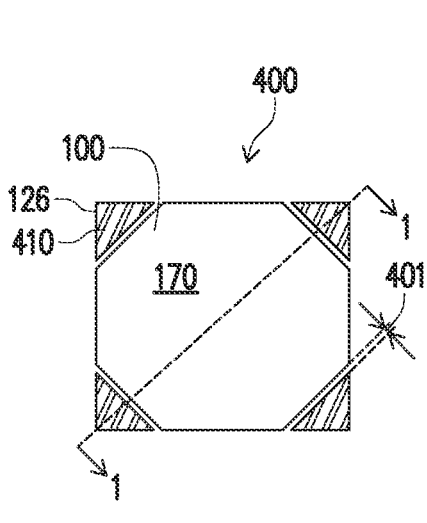
FIG. 4 is a top schematic view of a cell including the structure of FIG. 1.
Figure 4:

Referring now to FIG. 4, an overhead view of a single cell 400 including the structure 100 of FIG. 1 is shown according to the embodiment in which the holes 126 are distinct and not in physical connection. Such an embodiment may be referred to as a four pillar type metal connect. For example, the cross-sectional view of FIG. 1 may be taken along line 1-1 in FIG. 4. As above, the metal plug and passivation layer are collectively referred to as a passivated metal plug and are numbered 410. As shown, the hole 126 and passivated metal plug 410 are located at a distance 401 from the material region 170.

Figure 5:
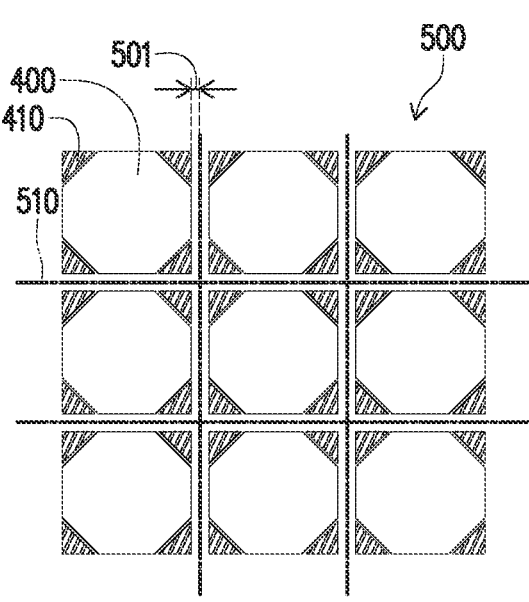
FIG. 5 is a top schematic view of an array of cells, such as the cell of FIG. 4, in accordance with some embodiments.

FIG. 5 illustrates an array 500 of cells 400, such as the cell 400 of FIG. 4. As shown, in the array 500, each cell 400 is separated and insulated from adjacent cells 400 by deep trench isolation (DTI) 510. Each passivated metal plug 410 is located at a distance 501 from each respective deep trench isolation (DTI) 510.

Figure 6:
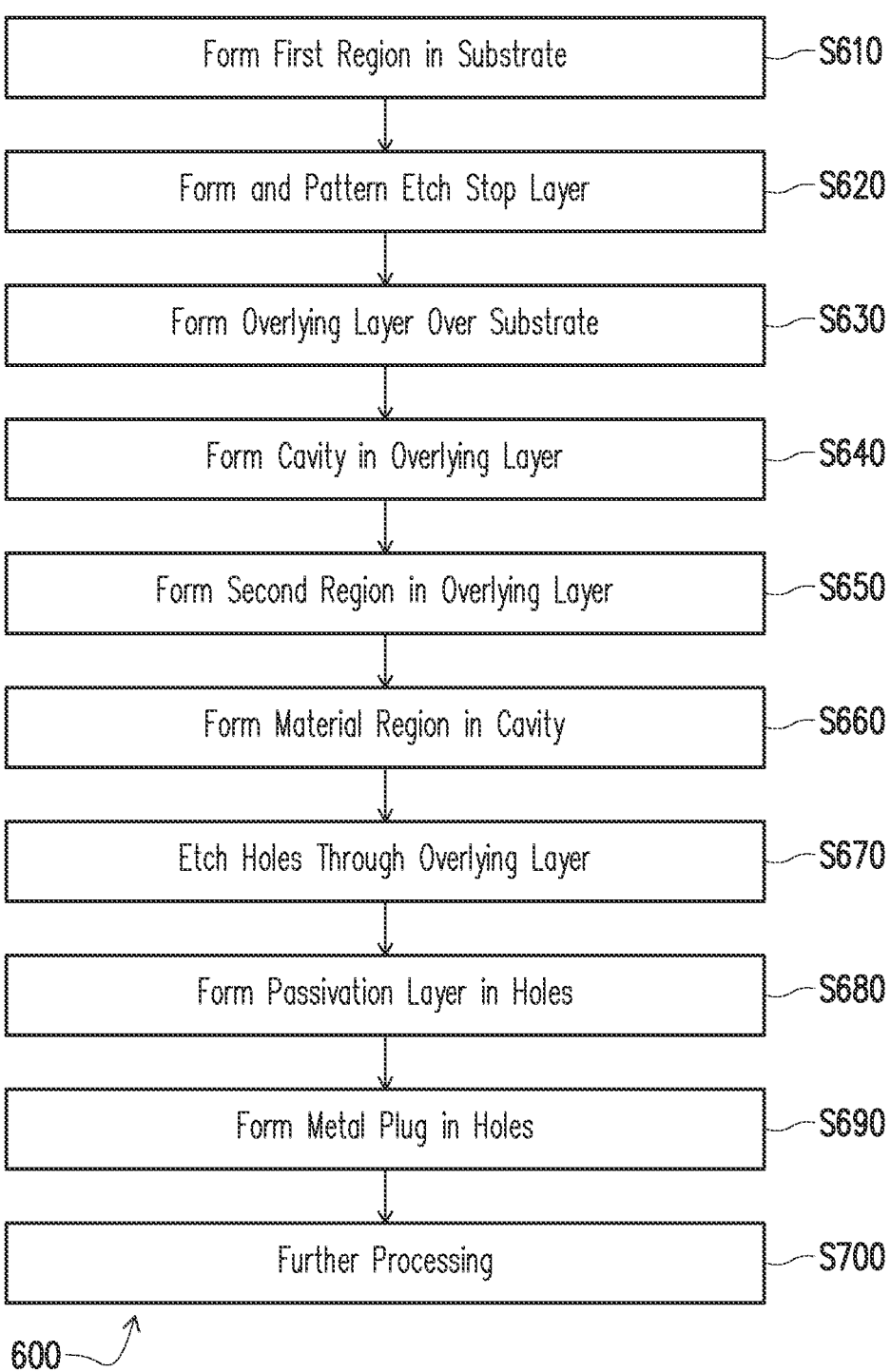
FIG. 6 is a flow chart illustrating a method in accordance with some embodiments.

Referring now to FIG. 6, a method 600 for fabricating a structure is illustrated. The method 600 may be described in conjunction with FIGS. 7-15, which are cross-sectional views, such as taken along lines 1-1 in FIG. 2 or FIG. 4, of the structure at sequential stages of fabrication.

Figure 7:
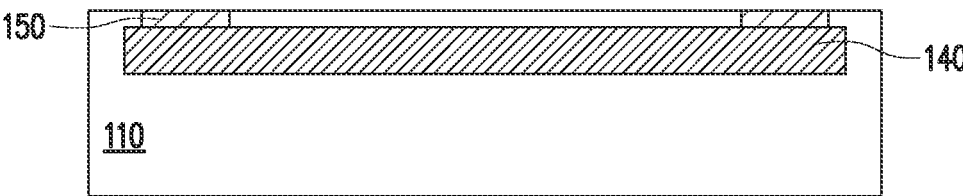
FIGS. 7-15 are cross-sectional schematic views of a structure during sequential fabrication stages in accordance with some embodiments.

Cross-referencing FIGS. 6 and 7, method 600 includes, at operation S610, doping a substrate 110 to form a first region or buried doped layer 140. Further, operation S610 may include forming more heavily doped regions 150. In certain embodiments, operation S610 includes N-doping to form an N-doped (N) region 110 and heavily N-doped (N+) regions 150.

Figure 8:
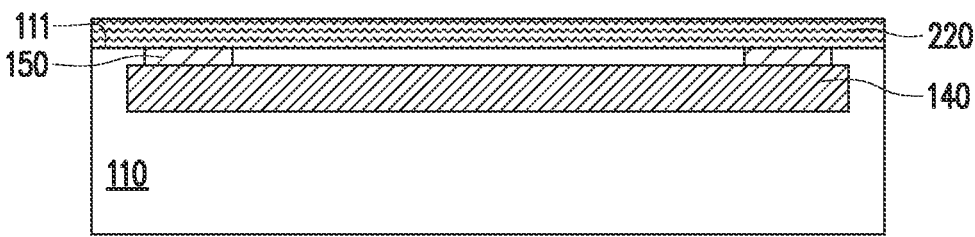
Figure 9:
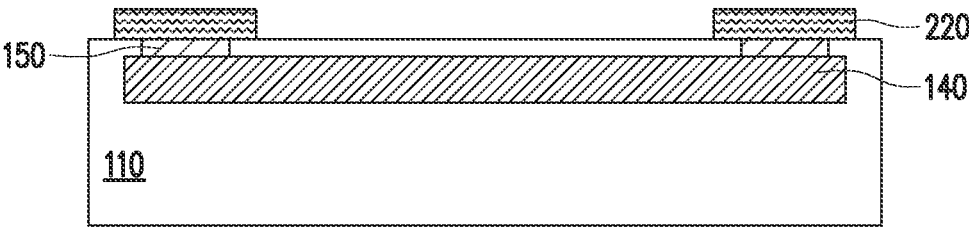

Cross-referencing FIGS. 6 and 8-9, method 600 includes, at optional operation S620, forming an etch stop layer 220 over the top surface 111 of the substrate 110 and patterning the etch stop layer 220 to locate the etch stop layer 220 only at locations over the more heavily doped regions 150. As indicated, certain embodiments may include formation of the etch stop layer 220 while other certain embodiments do not include formation of the etch stop layer 220.

Figure 10:
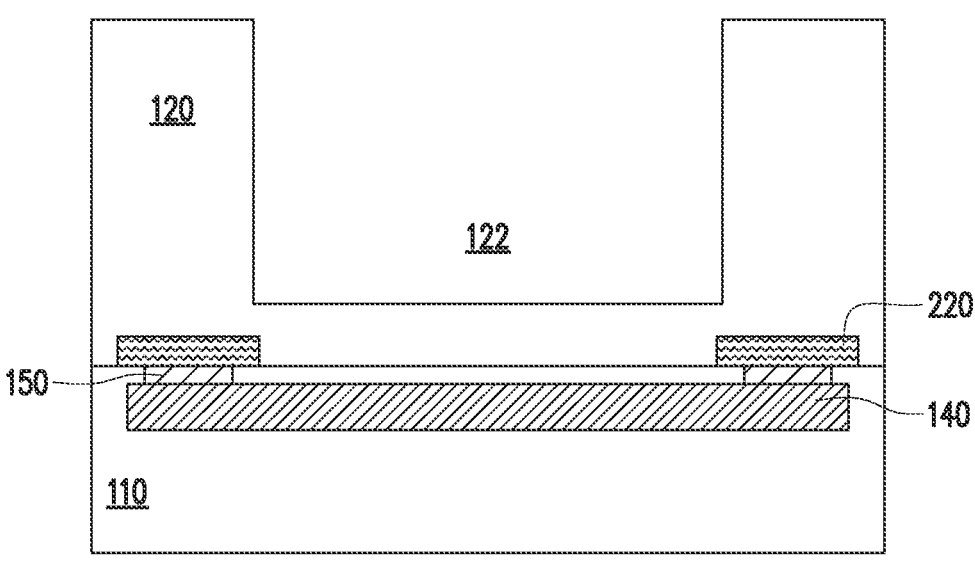

Cross-referencing FIGS. 6 and 10, method 600 includes, at operation S630, forming an overlying layer 120 over the substrate 110. In an exemplary embodiment, the overlying layer 120 is silicon formed by epitaxy. In exemplary embodiments, the overlying layer 120 is formed with a vertical thickness or height of from 0.5 to 10 micrometers (μm). Further, method 600 includes, at operation S640, forming a cavity 122 in the overlying layer 120.

Figure 11:
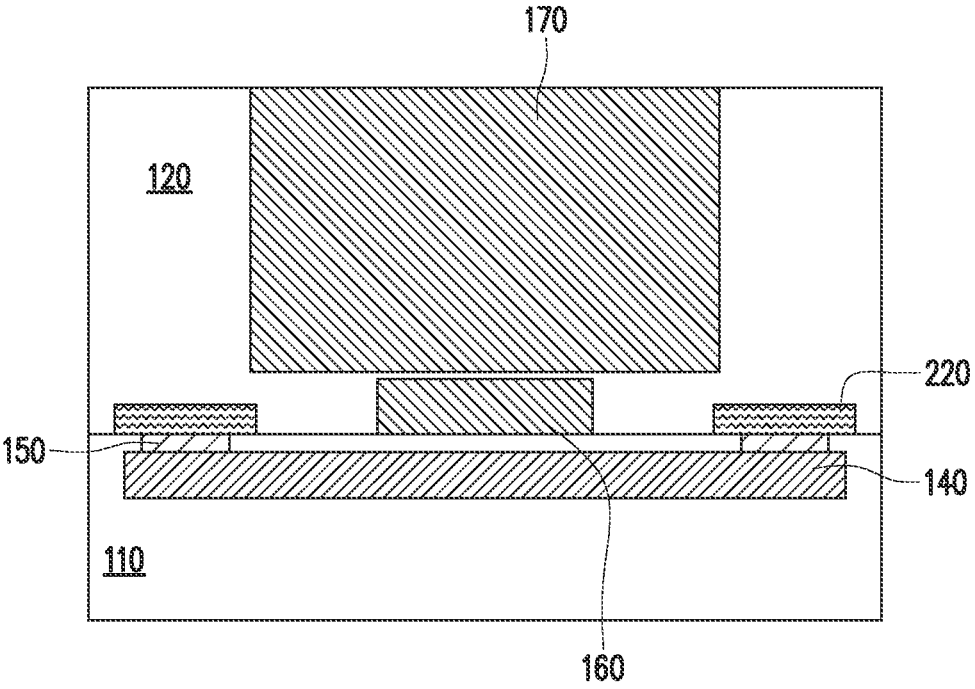

Cross-referencing FIGS. 6 and 11, method 600 includes, at optional operation S650, doping the overlying layer 120 to form second region or doped region 160. For example, when forming a structure, method 600 may include doping the overlying layer 120 to form second region or doped region 160. On the other hand, when forming a heterojunction diode, such as a P—Ge/i-Si/N—Si structure, method 600 may omit forming second region or doped region 160.

Further, method 600 includes, at operation S660, forming the material region 170 in the cavity. For example, material region 170 may be formed by epitaxially growing germanium in the cavity.

Figure 12:
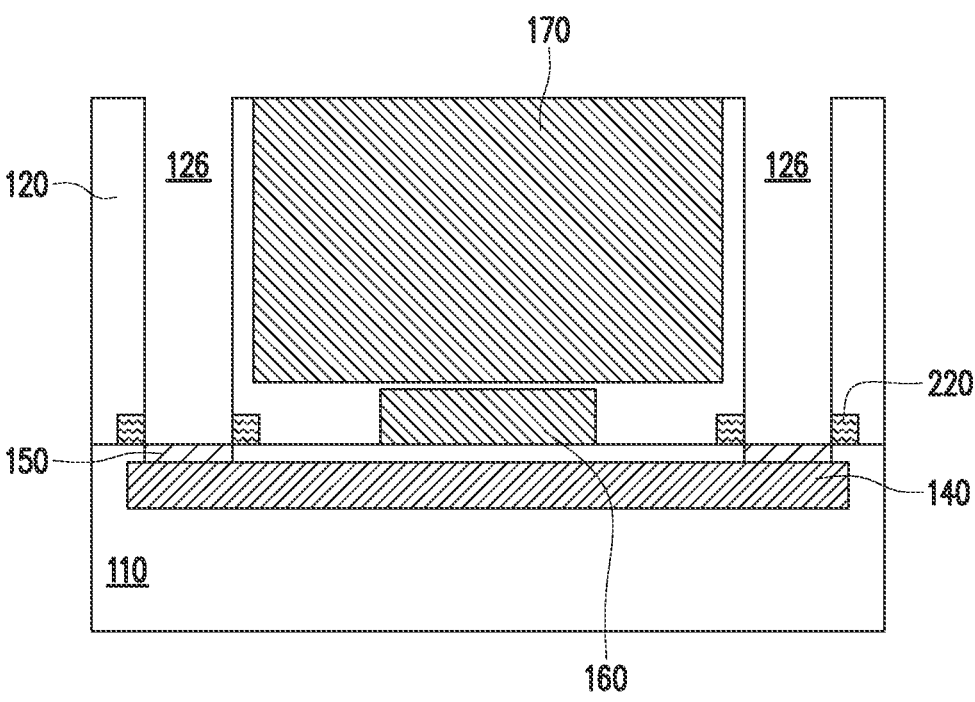

Cross-referencing FIGS. 6 and 12, method 600 includes, at operation S670, etching holes 126 through the overlying layer 120 to the substrate 110. For example, a dry etch process may be used to form holes 126. In an exemplary embodiment, operation S670 involves a silicon deep trench etching process. As described above, the holes 126 may be a single annular hole or distinct holes. In embodiments including the etch stop layer 220, the deep trench etch process may be controlled by finishing at the etch stop layer 220. Then, as shown, operation S670 may include stripping the etch stop layer 220 that is exposed by the deep trench etch process. As a result, the holes 126 land on the more heavily doped regions 150 in the substrate 110. In embodiments in which the optional etch stop layer 220 is not used, the deep trench etch process may finish and land on the more heavily doped regions 150 in the substrate 110.

Figure 13:
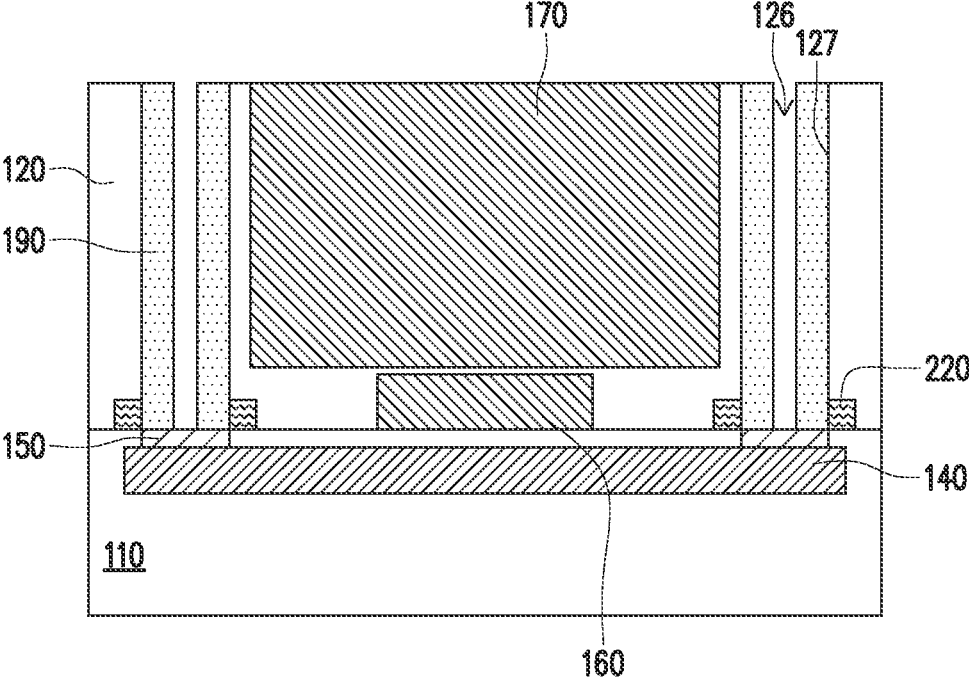

Cross-referencing FIGS. 6 and 13, method 600 includes, at operation S680, forming a passivation layer 190 along sidewalls 127 of the holes 126. Specifically, the passivation layer 190 completely covers and seals the sidewalls 127 so that the overlying layer 120 is separated from the remaining holes 126 within the passivation layer 190. In an exemplary embodiment, a selective process is performed to form the passivation layer 190 on the sidewalls 127 and not on the surface of the more heavily doped region 150. In exemplary embodiments, the passivation layer 190 is silicon oxide or a high-k dielectric material.

Figure 14:
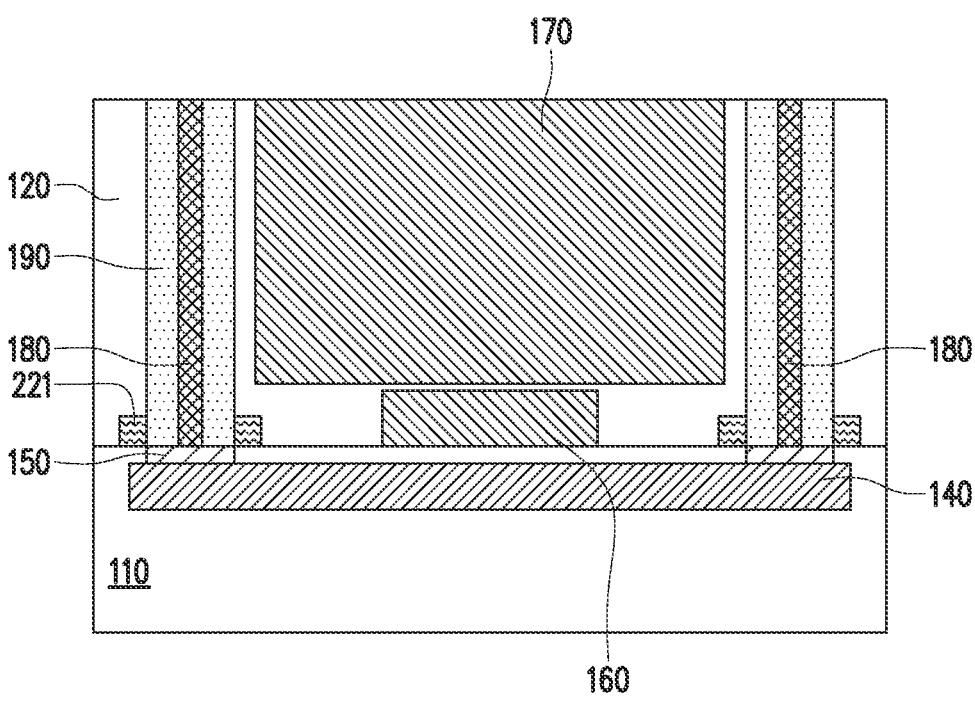

Cross-referencing FIGS. 6 and 14, method 600 includes, at operation S690, filling the holes 126 to form a metal connection or plug 180 inside the passivation layer 190 and in contact with the more heavily doped region 150. As a result, a conductive connection to the buried doped layer 140 is formed without requiring any doping of the conductive path.

Figure 15:
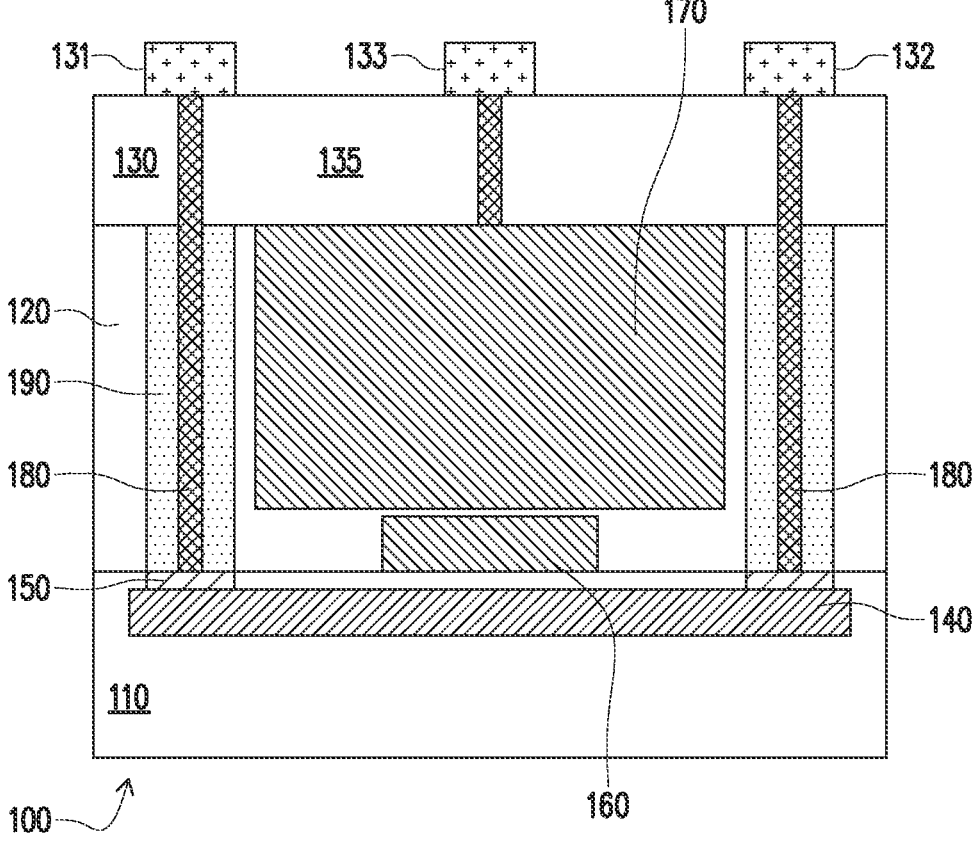

Cross-referencing FIGS. 6 and 15, method 600 may include further processing at operation S700, such as depositing and patterning dielectric and conductive layers to form cathodes 131 and 132 and anode 133 in desired electrical connect to the metal plugs 180 or material region 170. It is noted that in the fabricated structure 100 of FIG. 15, the etch stop layer remnants 221 are not illustrated in accordance with embodiments in which the etch stop layer 220 is not used. FIG. 1 illustrates a fabricated structure 100 including the etch stop layer remnants 221.

Figure 16:
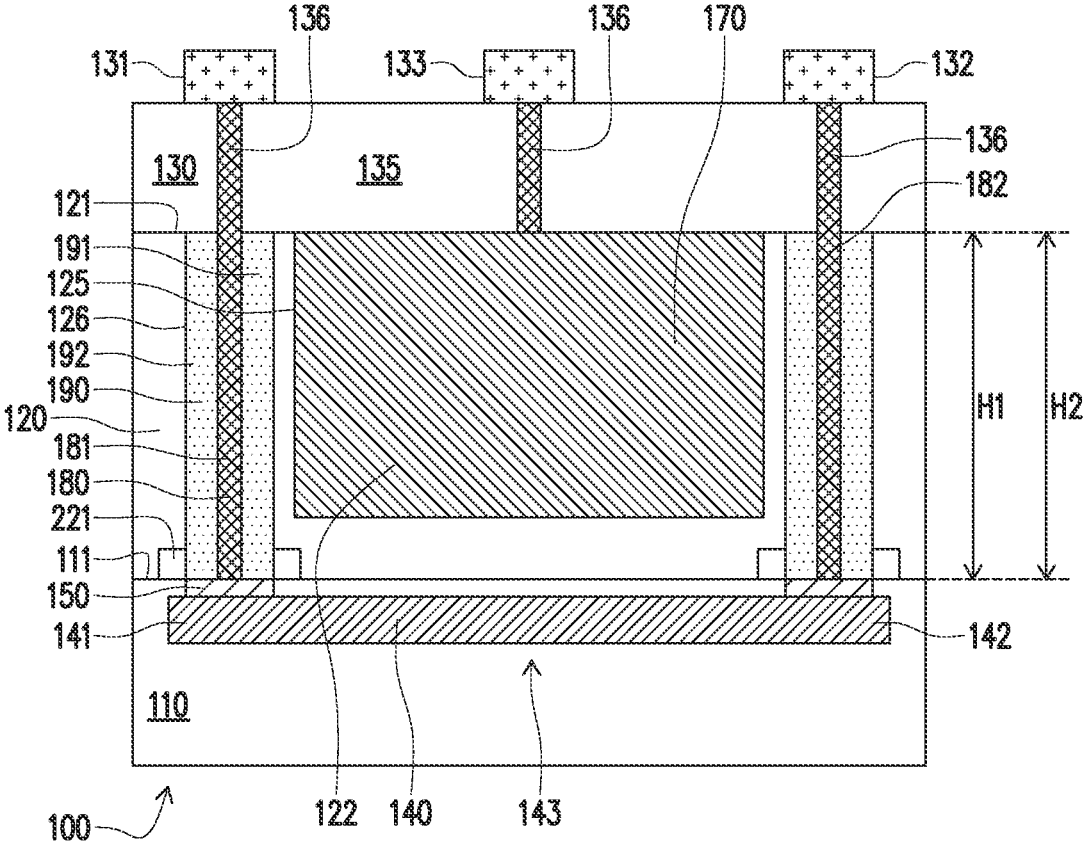
FIG. 16 is a cross-sectional schematic view of another structure in accordance with some embodiments.

While FIGS. 1-15 illustrate a structure 100 in the context of a SPAD structure, embodiments of the doping free connections are not so limited. For example, FIG. 16 illustrates a similar structure 100 in the form of a heterojunction diode. As shown in FIG. 16, metal connections or plugs 180 are located in the holes 126 and extend from contact with the buried doped layer 140 (through more heavily doped regions 150) to the upper interface 121. Each metal plug 180 is laterally distanced from the material region 170. Further, each metal plug 180 is surrounded by a passivation layer 190. Only the bottom surfaces of the metal connections 180 (in electrical contact with the more highly doped regions 150) and the top surface of the metal connections 180 (in electrical connection with overlying contacts described below) are not contacted by the passivation layer 190. The passivation layer 190 completely separates the metal connections 180 from the overlying layer 120.

It is contemplated that the connection structures described herein may be utilized with other devices or structures not described or illustrated in detail, such as structures which may utilize a vertical electrical connection path in silicon.

A structure is provided in certain embodiments, and includes a substrate; a first region of a first conductivity type formed in the substrate; an overlying layer located over the substrate; a well region of a second conductivity type formed in the overlying layer; a conductive plug laterally adjacent to the well region and extending through the overlying layer into electrical contact with the first region; and a passivation layer located between the conductive plug and the well region.

In certain embodiments of the structure, the passivation layer surrounds the conductive plug.

In certain embodiments of the structure, the first region extends from a first end to a second end and has a central portion therebetween; the well region lies over the central portion of the first region; the conductive plug comprises a first conductive plug portion and a second conductive plug portion; the first conductive plug portion extends to contact the first end of the first region; the second conductive plug portion extends to contact the second end of the first region; a first portion of the passivation layer is located between the first portion of the conductive plug and the well region; and a second portion of the passivation layer is located between the second portion of the conductive plug and the well region. In certain embodiments, the conductive plug is an annular ring, and the first conductive plug portion and the second conductive plug portion are portions of the annular ring. In certain embodiments, the first conductive plug portion is not connected to the second conductive plug portion, and the first portion of the passivation layer is not connected to the second portion of the passivation layer.

In certain embodiments of the structure, the conductive plug has a first height, the overlying layer has a second height, and the first height is greater than or equal to the second height.

In certain embodiments of the structure, the overlying layer is comprised of silicon and the well region is comprised of germanium.

In certain embodiments of the structure, the passivation layer is an oxide.

In certain embodiments, the structure further includes a deep trench isolation, and the conductive plug is located between the deep trench isolation and the well region.

A cell is provided in certain embodiments and includes an anode and a cathode; a first-type doped well connected to the anode; a second-type doped buried layer; a metal plug directly connected to the buried layer and to the cathode; and a passivation layer located between the metal plug and the well.

In certain embodiments of the cell, the passivation layer surrounds the metal plug.

In certain embodiments, the cell further includes an epitaxial layer, the well is formed in the epitaxial layer, the metal plug passes through the epitaxial layer, and the passivation layer prevents contact between the metal plug and the epitaxial layer.

In certain embodiments, the cell further includes a deep trench isolation defining a perimeter of the cell, and the metal plug is located between the deep trench isolation and the well.

In certain embodiments of the cell, the metal plug is an annular ring surrounding the well.

A method is provided according to certain embodiments and includes forming a first region of a first conductivity type in a substrate; forming an epitaxial layer overlying the substrate; forming a well region of a second conductivity type in the epitaxial layer; and forming a passivated metal plug through the epitaxial layer to contact with the first region.

In certain embodiments of the method, forming the passivated metal plug through the epitaxial layer to contact with the first region includes: etching a hole in the epitaxial layer, wherein the hole contacts the first region; lining the hole with a passivation layer; and filling the hole with a metal, wherein the passivation layer surrounds the metal.

In certain embodiments, the method further includes forming an etch stop layer over the substrate before forming the epitaxial layer, and forming the passivated metal plug through the epitaxial layer to contact with the first region includes: performing an etching process to etch a hole in the epitaxial layer, wherein the etching process lands on the etch stop layer; lining the hole with a passivation layer; and filling the hole with a metal, wherein the passivation layer surrounds the metal.

In certain embodiments, the method further includes forming a second region of the second conductivity type in the epitaxial layer.

In certain embodiments of the method, forming the well region of the second conductivity type in the epitaxial layer includes: etching the epitaxial layer to form a cavity; and filling the cavity with germanium.

In certain embodiments, the method further includes forming an anode in electrical connection with the well region and forming a cathode in electrical connection with the passivated metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A structure comprising:
a first region of a first conductivity type;
an overlying layer located over the first region;
a well region of a second conductivity type formed in the overlying layer;
a conductive plug laterally adjacent to the well region and extending through the overlying layer to electrically contact with the first region; and
a passivation layer located between the conductive plug and the well region, wherein the passivation layer is an oxide.

2. The structure of claim 1, wherein the passivation layer surrounds the conductive plug.

3. The structure of claim 1, wherein:
the first region extends from a first end to a second end and has a central portion therebetween;
the well region lies over the central portion of the first region;
the conductive plug comprises a first conductive plug portion and a second conductive plug portion;
the first conductive plug portion extends to contact the first end of the first region;
the second conductive plug portion extends to contact the second end of the first region;
a first portion of the passivation layer is located between the first portion of the conductive plug and the well region; and
a second portion of the passivation layer is located between the second portion of the conductive plug and the well region.

4. The structure of claim 3, wherein the conductive plug is an annular ring, and wherein the first conductive plug portion and the second conductive plug portion are portions of the annular ring.

5. The structure of claim 3, wherein the first conductive plug portion is not connected to the second conductive plug portion, and wherein the first portion of the passivation layer is not connected to the second portion of the passivation layer.

6. The structure of claim 1, wherein the conductive plug has a first height, wherein the overlying layer has a second height, and wherein the first height is greater than or equal to the second height.

7. The structure of claim 1, wherein the overlying layer is comprised of silicon and the well region is comprised of germanium.

8. The structure of claim 1, further comprising a deep trench isolation, wherein the conductive plug is located between the deep trench isolation and the well region.

9. A cell comprising:
an anode and a cathode;
a first-type doped well connected to the anode;
a second-type doped buried layer;
a conductive plug directly connected to the buried layer and to the cathode; and
a passivation layer located between the conductive plug and the well.

10. The cell of claim 9, wherein the passivation layer surrounds the conductive plug.

11. The cell of claim 9, further comprising an epitaxial layer, wherein the well is formed in the epitaxial layer, wherein the conductive plug passes through the epitaxial layer, and wherein the passivation layer prevents contact between the conductive plug and the epitaxial layer.

12. The cell of claim 9, further comprising a deep trench isolation defining a perimeter of the cell, wherein the conductive plug is located between the deep trench isolation and the well.

13. The cell of claim 9, wherein the conductive plug is an annular ring surrounding the well.

14. The cell of claim 9, wherein the passivation layer is an oxide.

15. The cell of claim 9, wherein the passivation layer is a high-k dielectric material.

16. The cell of claim 9, wherein the conductive plug has a first height, the epitaxial layer has a second height, and the first height is greater than or equal to the second height.

17. The cell of claim 9, wherein the buried layer extends from a first end to a second end and has a central portion therebetween, the well lies over the central portion of the buried layer, and the conductive plug extends to contact at least one of the first end or the second end of the buried layer.

18. The cell of claim 9, wherein the conductive plug is a metal plug.

19. A structure comprising:
a first region of a first conductivity type;
an overlying layer located over the first region;
a well region of a second conductivity type formed in the overlying layer;
a deep trench isolation; and
a conductive plug located between the deep trench isolation and the well region and extending through the overlying layer to electrically contact with the first region.

20. The structure of claim 19, further comprising a passivation layer located between the conductive plug and the well region.

* * * * *